United States Patent
Sakakura

(10) Patent No.: US 8,736,266 B2
(45) Date of Patent: May 27, 2014

(54) MAGNETIC RESONANCE IMAGING APPARATUS

(75) Inventor: Yoshitomo Sakakura, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 862 days.

(21) Appl. No.: 12/892,061

(22) Filed: Sep. 28, 2010

(65) Prior Publication Data

US 2011/0074421 A1 Mar. 31, 2011

(30) Foreign Application Priority Data

Sep. 28, 2009 (JP) ................................. 2009-223239
Aug. 17, 2010 (JP) ................................. 2010-182462

(51) Int. Cl.
*G01V 3/00* (2006.01)

(52) U.S. Cl.
USPC ........................................................ 324/318

(58) Field of Classification Search
USPC ................................................. 324/300–322
See application file for complete search history.

(56) References Cited

U.S. PATENT DOCUMENTS

| 5,489,848 | A | * | 2/1996 | Furukawa | 324/318 |
| 6,011,394 | A | * | 1/2000 | Petropoulos et al. | 324/318 |
| 6,441,614 | B1 | | 8/2002 | Edelstein et al. | |
| 7,015,692 | B2 | * | 3/2006 | Clarke et al. | 324/300 |
| 7,135,863 | B2 | * | 11/2006 | Arik et al. | 324/318 |
| 7,140,420 | B2 | * | 11/2006 | Arik et al. | 165/80.2 |
| 7,154,270 | B2 | * | 12/2006 | Arz et al. | 324/318 |
| 7,301,343 | B1 | * | 11/2007 | Sellers et al. | 324/318 |
| 7,439,741 | B2 | * | 10/2008 | Arik et al. | 324/318 |
| 7,449,889 | B1 | * | 11/2008 | Huang et al. | 324/318 |
| 7,489,131 | B2 | * | 2/2009 | Lvovsky | 324/307 |
| 7,554,326 | B2 | * | 6/2009 | Sakakura | 324/318 |
| 7,570,058 | B1 | * | 8/2009 | Wong et al. | 324/318 |
| 7,741,847 | B2 | * | 6/2010 | Nakabayashi et al. | 324/320 |
| 7,868,617 | B2 | * | 1/2011 | Seeber et al. | 324/318 |
| 8,203,341 | B2 | * | 6/2012 | Teklemariam et al. | 324/318 |
| 8,305,079 | B2 | * | 11/2012 | Iwasa et al. | 324/315 |
| 8,536,869 | B2 | * | 9/2013 | Kawamoto | 324/318 |

FOREIGN PATENT DOCUMENTS

| CN | 1623504 A | 6/2005 |
| CN | 101226232 A | 7/2008 |
| CN | 101261313 A | 9/2008 |
| JP | 11-128203 A | 5/1999 |

(Continued)

OTHER PUBLICATIONS

U.S. Appl. No. 12/773,234, Yoshitomo Sakakura, filed May 4, 2010.

(Continued)

*Primary Examiner* — Dixomara Vargas
(74) *Attorney, Agent, or Firm* — Nixon & Vanderhye PC

(57) ABSTRACT

A magnetic resonance imaging apparatus according to an embodiment includes a gradient coil and a coil cooling pipe. The gradient coil applies a gradient magnetic field onto a subject placed in a static magnetic field. The coil cooling pipe is provided to the gradient coil, and cools the gradient coil by circulating a coolant inside pipe. The coil cooling pipe is provided so as to extend from one end of the gradient coil in the direction toward the other end, then to bend, and to return to the one end along the shape of the gradient coil.

18 Claims, 8 Drawing Sheets

(56) References Cited

FOREIGN PATENT DOCUMENTS

| JP | 2005-279168 | 10/2005 |
| JP | 2006-116300 A | 5/2006 |
| JP | 2006-311957 | 11/2006 |

OTHER PUBLICATIONS

Office Action dated Jun. 29, 2012 in CN Application No. 201010292692.3.
Office Action dated Feb. 4, 2014 in JP 2010-182462 with English translation.

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2009-223239, filed on Sep. 28, 2009; and Japanese Patent Application No. 2010-182462, filed on Aug. 17, 2010, the entire contents of all of which are incorporated herein by reference.

FIELD

Embodiments described herein relate generally to a magnetic resonance imaging apparatus.

BACKGROUND

A magnetic resonance imaging apparatus is an apparatus that applies a radio-frequency magnetic field onto a subject placed in a static magnetic field, and detects a magnetic resonance signal generated from the subject due to the application of the radio-frequency magnetic field, thereby creating an image. Such magnetic resonance imaging apparatus includes a gradient coil that adds spatial positional information to a magnetic resonance signal by applying a gradient magnetic field onto the subject.

The gradient coil is repeatedly supplied with a pulse current while imaging, thereby generating heat to a large extent. Especially in recent years, a speedup in switching of a gradient magnetic field and an enhancement of the strength of a gradient magnetic field are strongly required along with the speedup in an imaging technology, so that heat generation by a gradient coil becomes more marked.

Heat generation by a gradient magnetic field has a possibility of giving influence on the quality of a taken image, or giving a pain to a subject to be imaged. For this reason, for example, a technology of cooling a gradient coil while imaging by circulating a coolant through cooling pipes provided inside the gradient coil has been proposed (for example, see JP-A 2006-311957 (KOKAI).

However, the conventional technology described above has a problem that ends of a gradient coil cannot be cooled as described below.

FIG. 10 is a schematic diagram for explaining a problem of the conventional technology using cooling pipes. FIG. 10 depicts a state of the inside of one end of a gradient coil that is formed in a substantial drum shape. As shown in FIG. 10, for example, in a gradient coil 1, a cooling pipe 2 is provided so as to be introduced in a direction from one end toward the other end of the gradient coil 1, then to be bent toward the circumferential direction, and then to reach the other end by being wound in a spiral fashion along the drum shape of the gradient coil 1.

In such case, for example, as shown in FIG. 10, an area 3 surrounded by the cooling pipes immediately after the introduction and the cooling pipe in the first lap is formed at an end of the gradient coil 1. No cooling pipe is arranged in the area 3, so that it is not cooled with coolant. As a result, for example, among a plurality of iron shims arranged in the gradient coil 1 to correct ununiformity of a static magnetic field in the imaging zone, an iron shim 5 arranged at the end of the gradient coil 1 becomes not to be cooled.

According to the conventional technology, there is a case where a plurality of cooling pipes are wound in parallel with a gradient coil in order to improve the cooling efficiency of the gradient coil. In such case, a wider space is further required for bending the cooling pipes at an end of the gradient coil, so that an area not to be cooled becomes wider.

DETAILED DESCRIPTION

A magnetic resonance imaging apparatus according to an embodiment includes a gradient coil and a coil cooling pipe. The gradient coil applies a gradient magnetic field onto a subject placed in a static magnetic field. The coil cooling pipe is provided to the gradient coil, and cools the gradient coil by circulating a coolant inside pipe. The coil cooling pipe is provided so as to extend from one end of the gradient coil in a direction toward an other end, then to bend, and to return to the one end along a shape of the gradient coil.

Exemplary embodiments of a Magnetic Resonance imaging apparatus (hereinafter, "MRI apparatus") will be explained below in detail with reference to the accompanying drawings. However, embodiments of the Magnetic Resonance Imaging apparatus are not limited by following embodiments. Moreover, the following embodiments are explained below in a case where water (hereinafter, "cooling water") is used as a coolant for cooling a gradient coil.

Figure 1:
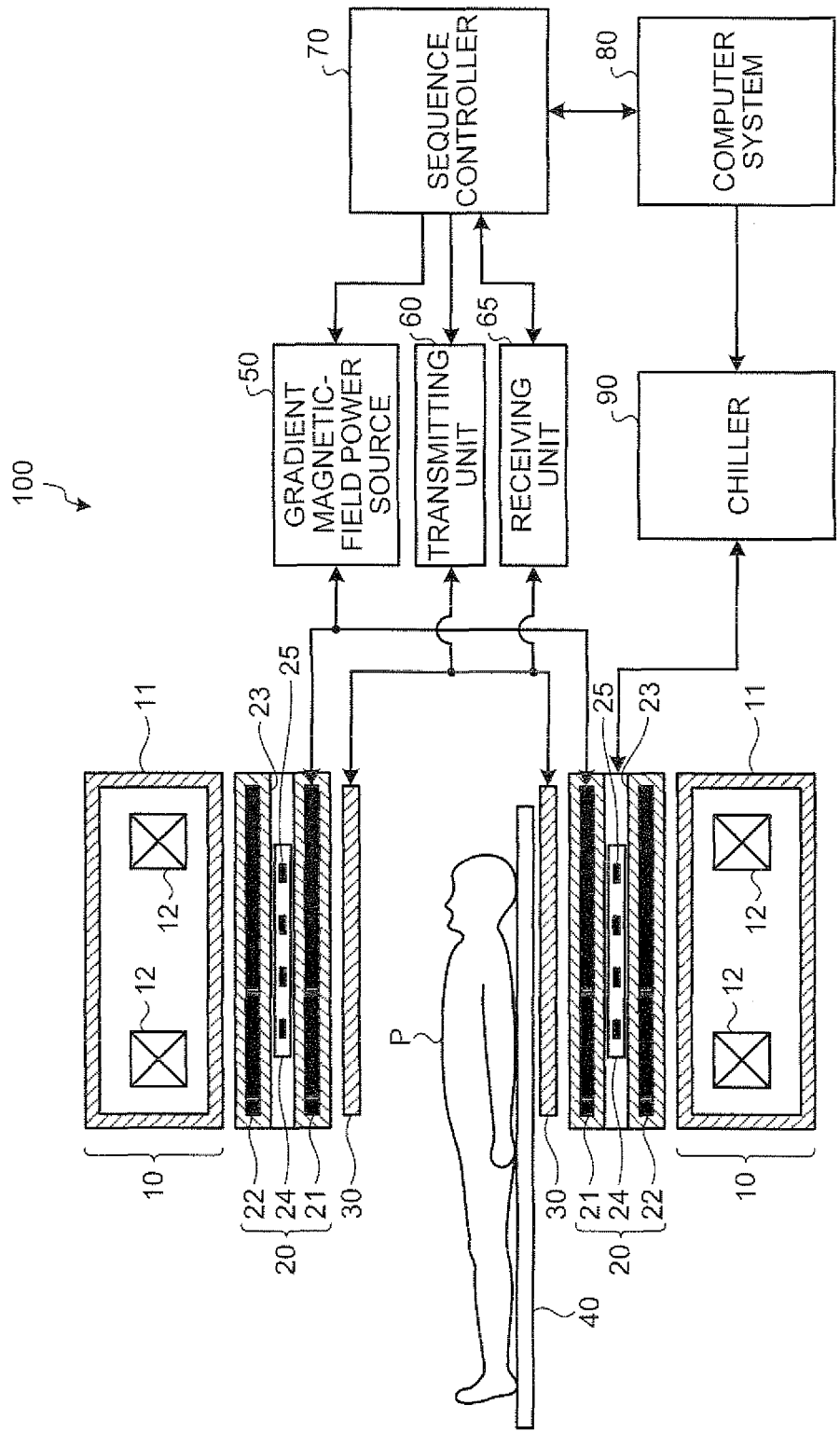
FIG. 1 is a configuration diagram that depicts a configuration of a Magnetic Resonance Imaging (MRI) apparatus according to a first embodiment.

First of all, a configuration of an MRI apparatus 100 according to a first embodiment is explained below. FIG. 1 is a configuration diagram that depicts a configuration of the MRI apparatus 100 according to the first embodiment. As shown in the figure, the MRI apparatus 100 includes a static magnetic-field magnet 10, a gradient coil 20, a Radio Frequency (RF) coil 30, a couchtop 40, a gradient magnetic-field power source 50, a transmitting unit 60, a receiving unit 65, a sequence controller 70, a computer system 80, and a chiller 90.

The static magnetic-field magnet 10 includes a vacuum container 11 that is formed in a substantial drum shape, and superconducting coils 12 that are immersed in a cooling liquid in the vacuum container 11; and generates a static magnetic field inside a bore (a space inside the drum of the static magnetic-field magnet 10), which is an imaging zone.

The gradient coil 20 is formed in a substantial drum shape, and provided on the inner side of the static magnetic-field magnet 10. The gradient coil 20 is a common Active Shield Gradient Coil (ASGC), and includes a main coil 21 and a shield coil 22. The main coil 21 applies gradient magnetic fields of which strengths vary in directions of the x-axis, the y-axis, and the z-axis, with a current supplied from the gradient magnetic-field power source 50. The shield coil 22 generates a magnetic field outside the main coil 21 with a current supplied from the gradient coil 20, thereby shielding the gradient magnetic fields generated by the main coil 21.

Shim-tray insert guides 23 are formed between the main coil 21 and the shield coil 22. In each of the shim-tray insert guides 23, inserted is a shim tray 24 that accommodates therein iron shims 25 configured to correct ununiformity of a magnetic field inside the bore. A structure of the gradient coil 20 will be explained later in detail.

The RF coil 30 is anchored on the inner side of the gradient coil 20 on opposite sides of the subject P. The RF coil 30 radiates a radio-frequency magnetic field onto the subject P based on an RF pulse transmitted from the transmitting unit 60. Moreover, the RF coil 30 receives a magnetic resonance signal emitted from the subject P by excitation of hydrogen nuclei.

The couchtop 40 is provided on a not-shown couch in a movable manner in the horizontal direction; and when performing a scan, the subject P is placed on the couchtop 40, and then the couchtop 40 is moved into the bore. The gradient magnetic-field power source 50 supplies power to the gradient coil 20 based on an instruction from the sequence controller 70.

The transmitting unit 60 transmits an RF pulse to the RF coil 30 based on an instruction from the sequence controller 70. The receiving unit 65 detects a magnetic resonance signal received by the RF coil 30, and transmits raw data obtained by digitizing the detected magnetic resonance signal, to the sequence controller 70.

The sequence controller 70 performs a scan of the subject P by activating the gradient magnetic-field power source 50, the transmitting unit 60, and the receiving unit 65, under the control of the computer system 80. As a result of performing the scan, when the raw data is transmitted from the receiving unit 65, the sequence controller 70 transmits the raw data to the computer system 80.

The computer system 80 controls the whole of the MRI apparatus 100. For example, the computer system 80 receives input of imaging conditions from an operator via an input unit, and causes the sequence controller 70 to execute a scan based on the received imaging conditions. Moreover, the computer system 80 reconstructs an image from raw data transmitted from the sequence controller 70. Furthermore, the computer system 80 displays a reconstructed image on a display unit.

The chiller 90 supplies cooling water to the cooling pipes provided to the gradient coil 20. Specifically, the chiller 90 supplies cooling water to each of a first cooling pipe and a second cooling pipe included in the gradient coil 20. Here, the chiller 90 supplies cooling water to each of the cooling pipes such that the direction of cooling water flowing through the first cooling pipe and the direction of cooling water flowing through the second cooling pipe are opposite to each other. The first embodiment is explained in a case where cooling water is used as a coolant, however, other kinds of coolant can be used.

Figure 2:
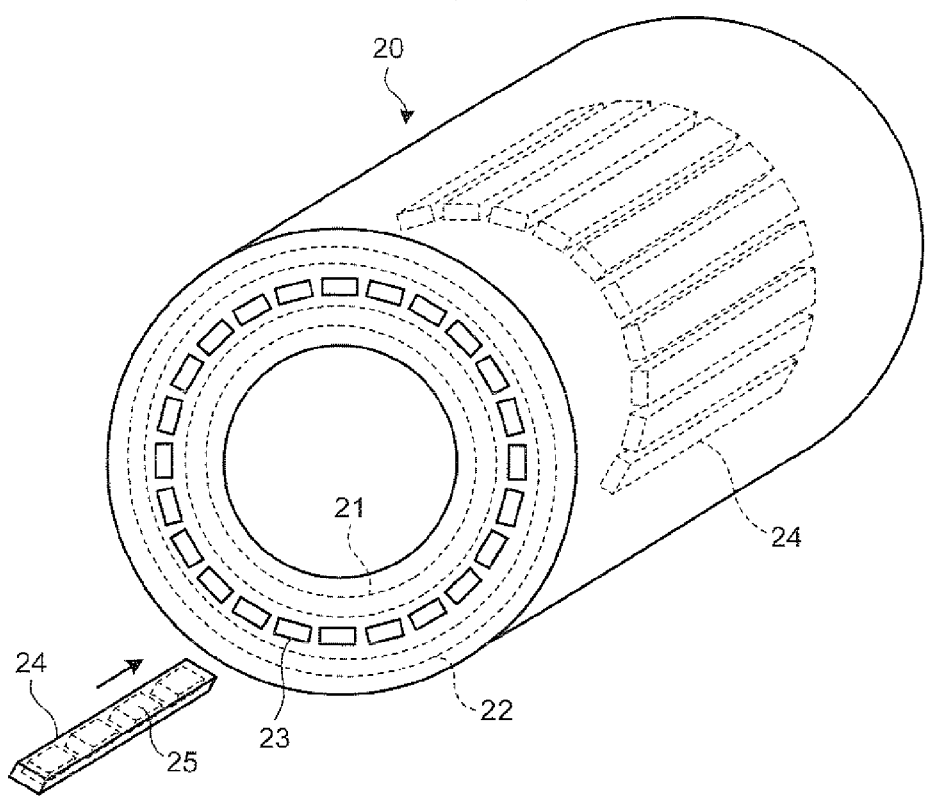
FIG. 2 is a perspective view that depicts a structure of a gradient coil according to the first embodiment.

A structure of the gradient coil 20 is explained below with reference to FIGS. 2 and 3. FIG. 2 is a perspective view that depicts a structure of the gradient coil 20 according to the first embodiment. As shown in FIG. 2, the gradient coil 20 includes the main coil 21 and the shield coil 22 each of which is formed in a substantial drum shape. The shim-tray insert guides 23 are formed between the main coil 21 and the shield coil 22.

Each of the shim-tray insert guides 23 is a through hole that forms openings at both ends of the gradient coil 20, and is formed along the whole length in the longitudinal direction of the gradient coil 20. The shim-tray insert guides 23 are formed so as to be in parallel with each other with regular intervals in the circumferential direction in a region between the main coil 21 and the shield coil 22. The shim tray 24 is inserted in each of the shim-tray insert guides 23.

Each of the shim trays 24 is manufactured from a resin that is a non-magnetic and nonconductive material, and formed substantially in a stick shape. Each of the shim trays 24 accommodates a certain number of the iron shims 25. Each of the shim trays 24 is inserted into each of the shim-tray insert guides 23, and anchored in the central part of the gradient coil 20.

Moreover, a plurality of cooling pipes is embedded in the gradient coil 20 in a spiral fashion along the drum shape, although they are not shown in FIG. 2. FIG. 3 is a structure diagram that depicts an internal structure of the gradient coil 20 according to the first embodiment. FIG. 3 depicts a part of the gradient coil 20. In FIG. 3, the upper-side surface depicts the outer circumferential surface of the gradient coil 20, and the lower-side surface depicts the inner circumferential surface of the gradient coil 20. The imaging zone in which a subject is to be placed is formed on the inner side of the gradient coil 20.

Figure 3:
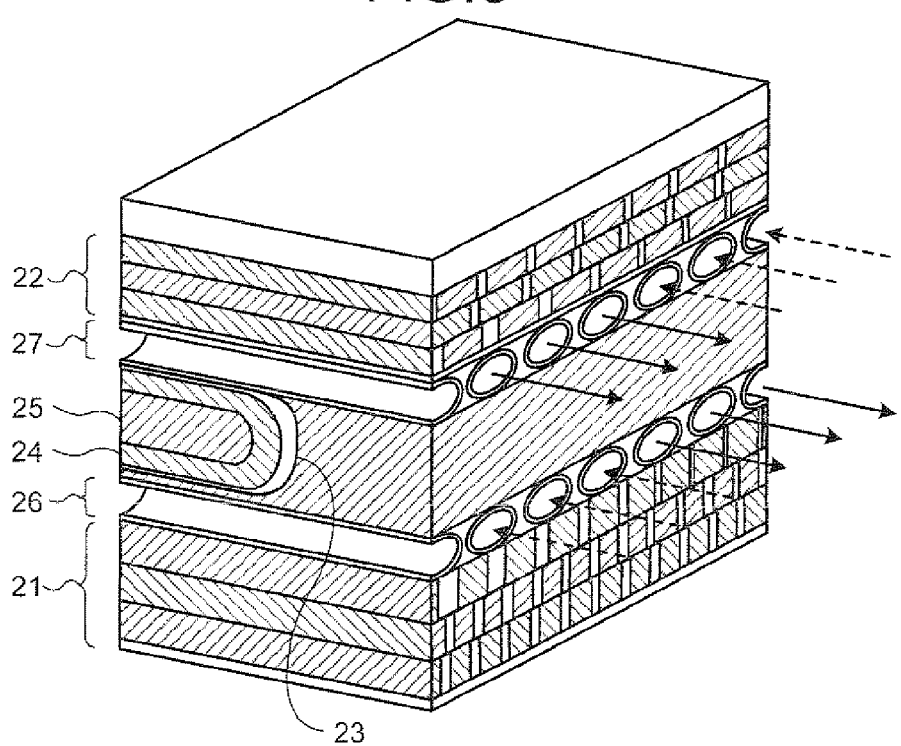
FIG. 3 is a structure diagram that depicts an internal structure of the gradient coil according to the first embodiment.

As shown in FIG. 3, specifically, in the gradient coil 20, a main-coil side cooling system 26 is embedded between the shim-tray insert guides 23 and the main coil 21. In addition, a shield-coil side cooling system 27 is embedded between the shim-tray insert guides 23 and the shield coil 22. Each of the main-coil side cooling system 26 and the shield-coil side cooling system 27 includes a plurality of cooling pipes that are embedded in a spiral fashion.

Specifically, the main-coil side cooling system 26 includes first cooling pipes and second cooling pipes that are provided to be in parallel with the first cooling pipes. The first cooling pipes circulate cooling water in a certain direction (the direction of solid-line arrows shown in FIG. 3), and the second cooling pipes circulate cooling water in the direction opposite to the direction in which the first cooling pipes circulate cooling water (the direction of broken-line arrows shown in FIG. 3). The shield-coil side cooling system 27 similarly includes first cooling pipes and second cooling pipes. A configuration of the main-coil side cooling system 26 and the shield-coil side cooling system 27 will be explained later in detail.

In this way, in the gradient coil 20, the main-coil side cooling system 26 is arranged between the main coil 21 and the iron shim 25, and the shield-coil side cooling system 27 is arranged between the shield coil 22 and the iron shim 25. The main-coil side cooling system 26 and the shield-coil side cooling system 27 are arranged on opposite sides of the iron shim 25. Accordingly, the iron shim 25 becomes resistant to conduction of heat generated by the main coil 21 and the shield coil 22.

A configuration of the main-coil side cooling system 26 and the shield-coil side cooling system 27 is explained below with reference to FIGS. 4 and 5. Each of the main-coil side cooling system 26 and the shield-coil side cooling system 27 has a similar configuration, therefore, a configuration of the shield-coil side cooling system 27 is explained below as an example.

Figure 4:
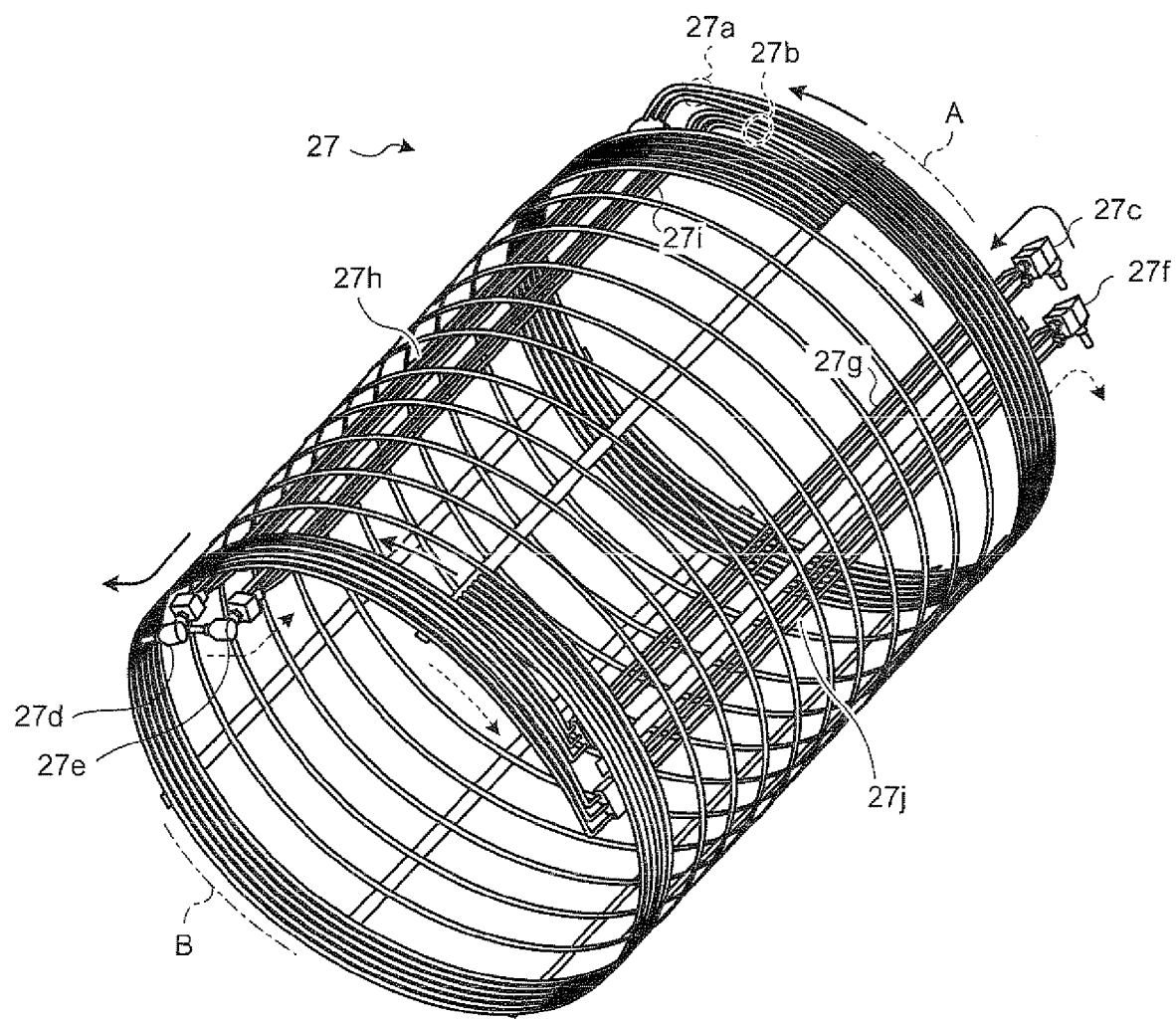
FIG. 4 is a perspective view that depicts a general configuration of a shield-coil side cooling system according to the first embodiment.

FIG. 4 is a perspective view that depicts a general configuration of the shield-coil side cooling system 27 according to the first embodiment. As shown in FIG. 4, the shield-coil side cooling system 27 includes three first cooling pipes 27a each of which is formed in a spiral fashion, and three second cooling pipes 27b that are provided in parallel with the first cooling pipes 27a. A manifold that causes cooling water to branch or to join is provided at each end of the first cooling pipes 27a and the second cooling pipes 27b. The manifold is formed from a metal, such as brass.

Specifically, an inlet-side manifold 27c is provided at one end of the first cooling pipes 27a, and an outlet-side manifold 27d is provided at the other end. The inlet-side manifold 27c branches cooling water supplied from the chiller 90, and flows the branched cooling water into each of the three of the first cooling pipes 27a. The outlet-side manifold 27d causes the cooling water flowing out from the three of the first cooling pipes 27a to join each other, and returns it to the chiller 90. The arrows of the solid lines shown in FIG. 4 indicate directions of cooling water flowing in the first cooling pipes 27a.

Similarly, an inlet-side manifold 27e is provided at one end of the second cooling pipes 27b, and an outlet-side manifold 27f is provided at the other end. The inlet-side manifold 27e branches cooling water supplied from the chiller 90, and flows the branched cooling water into each of the three of the second cooling pipes 27b. The outlet-side manifold 27f causes the cooling water flowing out from the three of the second cooling pipes 27b to join each other, and returns it to the chiller 90. The arrows of the broken lines shown in FIG. 4 indicate directions of cooling water flowing in the second cooling pipes 27b.

As shown in FIG. 4, the inlet-side manifold 27c of the first cooling pipes 27a and the inlet-side manifold 27e of the second cooling pipes 27b are provided at respective ends on opposite sides. The cutlet-side manifold 27d of the first cooling pipes 27a and the outlet-side manifold 27f of the second cooling pipes 27b are provided on respective opposite sides. In other words, the first cooling pipes 27a and the second cooling pipes 27b circulate cooling water in opposite directions, respectively.

Accordingly, the temperature of cooling water flowing in the second cooling pipes 27b is low at a position where the temperature of cooling water flowing in the first cooling pipes 27a is high, on the contrary, the temperature of cooling water flowing in the first cooling pipes 27a is low at a position where the temperature of cooling water flowing in the second cooling pipes 27b is high. Therefore, the temperature of cooling water is uniformed in the shield-coil side cooling system 27 as a whole, the gradient coil 20 can be uniformly cooled.

Each of the cooling pipes and each of the manifolds included in the shield-coil side cooling system 27 are connected to each other via a pipe formed from an insulating material.

Specifically, one end of each of the first cooling pipes 27a is connected to the inlet-side manifold 27c via a tube 27g that is formed from an insulating material. Moreover, the other end of each of the first cooling pipes 27a is connected to the outlet-side manifold 27d via a tube 27h that is formed from an insulating material. One end of each of the second cooling pipes 27b is connected to the inlet-side manifold 27e via a tube 27i that is formed from an insulating material. Moreover, the other end of each of the second cooling pipes 27b is connected to the outlet-side manifold 27f via a tube 27j that is formed from an insulating material.

In this way, by providing a tube formed from an insulating material between each of the cooling pipes and each of the manifolds included in the shield-coil side cooling system 27, forming of an electrical closed loop by each of the cooling pipes included in the shield-coil side cooling system 27 can be avoided.

Although a case of using a manifold made from a metal, such as brass, is explained here, a manifold formed from an insulating material, such as Teflon (registered trademark) or polyethylene terephthalate (PET), can be used. Accordingly, forming of an electrical closed loop by each of the cooling pipes can be securely prevented.

According to the first embodiment, each of the first cooling pipes 27a and the second cooling pipes 27b is provided so as to extend from one end of the gradient coil 20 in the direction toward the other end, then to bend, and to return to the one end by winding in a spiral fashion around the drum shape of the gradient coil 20.

For example, as shown in FIG. 4, each of the first cooling pipes 27a and the second cooling pipes 27b is provided so as to extend from an end A of the gradient coil 20 in the direction toward another end B, then to bend after reaching the end B, and to return to the end A by winding in a spiral fashion around the drum shape of the gradient coil 20. In this way, by keeping a distance between a position of bending each cooling pipe and a position of starting to wind, when winding and returning a cooling pipe in a spiral fashion to an end of the gradient coil 20, the cooling pipe can be wound up to a position close to the end of the gradient coil 20.

Figure 5:
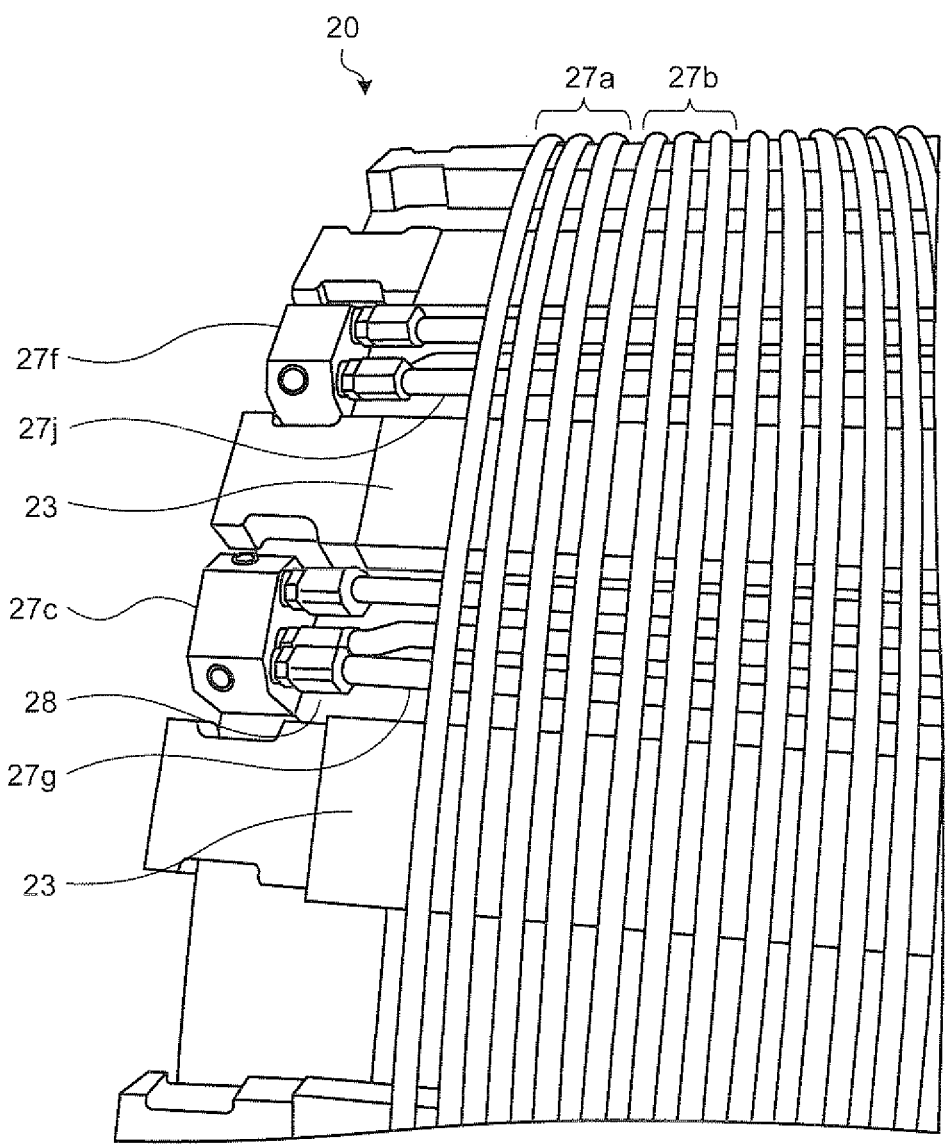
FIG. 5 is a schematic diagram that depicts an arrangement of first cooling pipes and second cooling pipes at one end of the gradient coil according to the first embodiment.

FIG. 5 is a schematic diagram that depicts an arrangement of the first cooling pipes 27a and the second cooling pipes 27b at the end A of the gradient coil 20 according to the first embodiment. As shown in FIG. 5, when the first cooling pipes 27a and the second cooling pipes 27b are arranged as explained above, the first cooling pipes 27a and the second cooling pipes 27b can be wound to the vicinity of the inlet-side manifold 27c and the vicinity of the outlet-side manifold 27f, respectively. Accordingly, an extent of a region not to be cooled that is conventionally produced at an end of the gradient coil 20 can be reduced.

Explained above is a case where each of the first cooling pipes 27a and the second cooling pipes 27b is provided so as to bend after reaching the other end from one end, and to return to the one end by winding in a spiral fashion around the drum shape of the gradient coil 20. However, for example, a cooling pipe can be provided so as to extend from one end in the direction toward the other end, to turn in the vicinity of the center of the length of the gradient coil 20, and to return to the one end. In such case, it is configured to start winding the first cooling pipes 27a and the second cooling pipes 27b from respective opposite ends. The position of turning each cooling pipe is not limited to the vicinity of the center of the length of the gradient coil 20, and can be a position shifted from the vicinity of the center to either of the ends.

Moreover, as shown in FIG. 5, a plurality of grooves 28 is formed on the gradient coil 20 along the direction from one end toward the other end of the drum. For example, the tubes 27g and the first cooling pipes 27a (not shown) are provided so as to be arranged in one of the grooves 28, to extend from one end of the gradient coil 20 in the direction toward the other end, then to bend, and to return to the one end by winding in a spiral fashion around the drum shape of the gradient coil 20. Similarly, the tubes 27j and the second cooling pipes 27b (not shown) are provided so as to be arranged in another of the grooves 28, to extend from one end of the gradient coil 20 in the direction toward the other end, then to bend, and to return to the one end by winding in a spiral fashion around the drum shape of the gradient coil 20. Accordingly, each of the cooling pipes can be efficiently arranged inside the gradient coil 20.

For example, as shown in FIG. 5, the grooves 28 are formed between the shim-tray insert guides 23 provided to the gradient coil 20. Accordingly, a part that is not conventionally used can be effectively used, and the iron shims 25 can be efficiently cooled.

As described above, according to the first embodiment, the MRI apparatus 100 includes the gradient coil 20 that is formed in a substantial drum shape and applies a gradient magnetic field onto a subject placed in a static magnetic field generated in the drum, and the main-coil side cooling system 26 and the shield-coil side cooling system 27 that are provided to the gradient coil 20, and cool the gradient coil 20 by circulating cooling water inside pipes. The cooling pipes included in the main-coil side cooling system 26 and the shield-coil side cooling system 27 are provided so as to extend from one end of the gradient coil 20 in the direction toward the other end, then to bend, and to return to the one end by winding in a spiral fashion around the drum shape of the gradient coil 20. Therefore, according to the first embodiment, the cooling pipes can be wound up to positions close to the ends of the gradient coil 20, thereby being capable to cool even the ends of the gradient coil 20.

Moreover, according to the first embodiment, the cooling pipes included in the main-coil side cooling system 26 and the shield-coil side cooling system 27 are provided so as to extend from one end of the gradient coil 20 in the direction toward the other end, then to bend after reaching the other end, and to return to the one end by winding in a spiral fashion around the drum shape of the gradient coil 20. Therefore, according to the first embodiment, work of winding the cooling pipes can be finished by one time, so that cooling pipes can be easily arranged in the gradient coil 20.

Furthermore, according to the first embodiment, the gradient coil 20 includes the grooves 28 that are formed along the direction from one end toward the other end of the drum. The cooling pipes included in the main-coil side cooling system 26 and the shield-coil side cooling system 27 are provided so as to be arranged in one of the grooves 28 included in the gradient coil 20, to extend from one end of the gradient coil 20 in the direction toward the other end, then to bend, and to return to the one end by winding in a spiral fashion around the drum shape of the gradient coil 20. Therefore, according to the first embodiment, the cooling pipe can be efficiently arranged in the gradient coil 20, so that the diameter of the bore to be an imaging zone can be made large.

Moreover, according to the first embodiment, the gradient coil 20 includes a plurality of the shim-tray insert guides 23 each of which is a through hole that forms openings at the both ends of the gradient coil 20, and includes the shim trays 24 inserted that accommodate the iron shims 25 configured to correct ununiformity of a static magnetic field. The grooves 28 are then formed between the shim-tray insert guides 23. Therefore, according to the first embodiment, a part that is not conventionally used can be effectively used, and the iron shims 25 can be efficiently cooled.

Furthermore, according to the first embodiment, each of the main-coil side cooling system 26 and the shield-coil side cooling system 27 includes a plurality of cooling pipes arranged in parallel, the inlet-side manifold branches cooling water supplied from the chiller 90, and flows the branched cooling water into each of the cooling pipes. Additionally, the outlet-side manifold causes the cooling water flowing out from each of the cooling pipes to join each other, and returns it to the chiller 90. Each of the cooling pipes and the inlet-side manifold and the outlet-side manifold included in the main-coil side cooling system 26 and the shield-coil side cooling system 27 are connected to one another via a tube formed from an insulating material. Accordingly, forming of an electrical closed loop by each of the cooling pipes included in the main-coil side cooling system 26 and the shield-coil side cooling system 27 can be avoided. Therefore, according to the first embodiment, electromagnetic coupling between a cooling pipe and the gradient coil can be avoided, so that uniformity of a static magnetic field inside the imaging zone can be stabilized.

Moreover, according to the first embodiment, each of the main-coil side cooling system 26 and the shield-coil side cooling system 27 includes the first cooling pipes that circulate cooling water in a certain direction, and the second cooling pipes that are provided in parallel with the first cooling pipes. The second cooling pipes circulate cooling water in the direction opposite to the direction to which the first cooling pipes circulates cooling water. Therefore, according to the first embodiment, the temperature of cooling water becomes uniform in the main-coil side cooling system 26 and the shield-coil side cooling system 27 as a whole, so that the imaging zone in which the subject P is placed can be evenly cooled.

Although the first embodiment is explained above in a case where each of the main-coil side cooling system 26 and the shield-coil side cooling system 27 includes the first cooling pipes and the second cooling pipes three each, the embodiment is not limited to this. For example, when the number of cooling pipes is increased, the length of an individual cooling pipe can be short. As a result, a pressure loss in each cooling pipe is suppressed, so that a flow rate of cooling water can be increased. Accordingly, the imaging zone can be more efficiently cooled.

The first embodiment is explained above in a case where each of the cooling pipes included in the main-coil side cooling system 26 and the shield-coil side cooling system 27 is wound and arranged in a similar manner. However, either of the main-coil side cooling system 26 or the shield-coil side cooling system 27 can be provided as wounded as shown in FIG. 4.

For example, an area available to arrange cooling pipes may be sometimes restricted in the gradient coil 20 due to a structure in some cases. For example, when intervals of forming the shim-tray insert guides 23 are narrow, the width of the grooves 28 shown in FIG. 5 becomes small, consequently, there is a possibility that tubes of both of the main-coil side cooling system 26 and the shield-coil side cooling system 27 cannot be arranged inside the grooves 28. In such case, one of the main-coil side cooling system 26 and the shield-coil side cooling system 27 is wound as shown in FIG. 4.

Even when the width of the grooves 28 is sufficiently large, winding the cooling pipes of any one of the cooling systems as shown in FIG. 4 is more efficient in working efficiency when arranging cooling pipes, compared with when winding the cooling pipes of the both of the systems in a similar manner. Generally, in an ASGC, a shield coil is arranged across a wide range in the drum direction of a gradient coil than a range in which a main coil is arranged. Therefore, it is desirable for improvement in cooling efficiency that at least the cooling pipes of the shield-coil side cooling system 27 is to be provided as shown in FIG. 4.

A second embodiment is explained below. The first embodiment is explained above in a case where the gradient coil 20 includes cooling pipes between the main coil 21 and the shield coil 22. However, recently, there is a case where a gradient coil further includes a cooling pipe on the inner circumferential side of a main coil. Therefore, the second embodiment is explained below in a case where the gradient coil 20 of the MRI apparatus 100 according to the first embodiment further includes cooling pipes on the inner circumferential side of the main coil 21.

Figure 6:
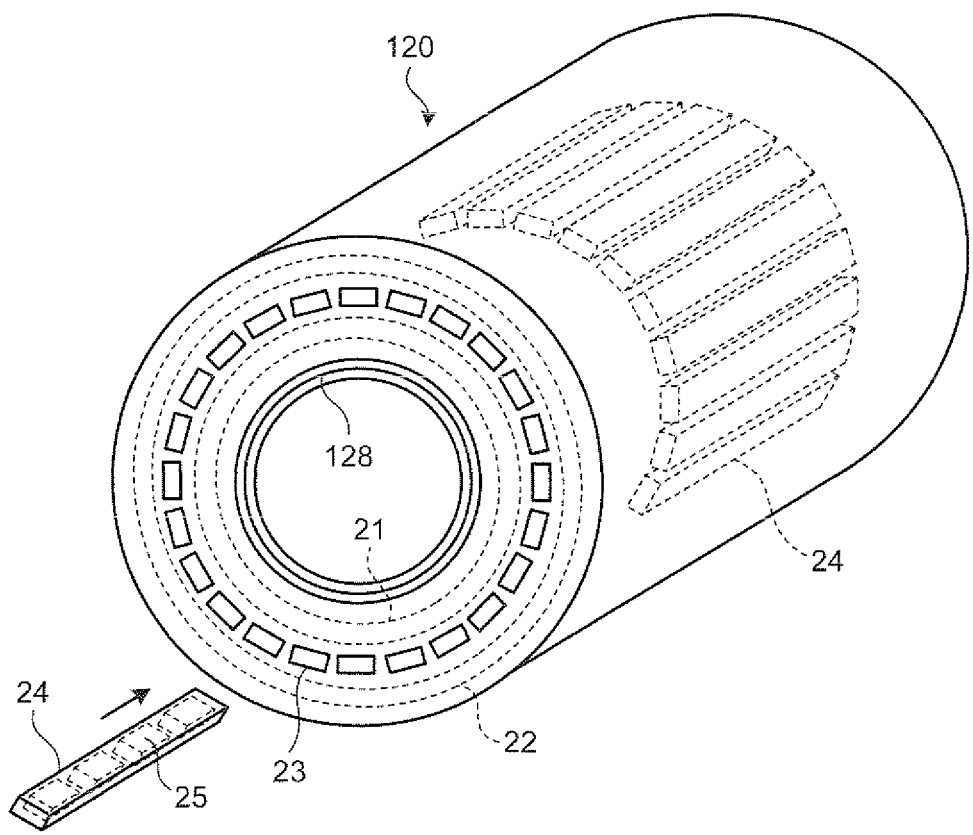
FIG. 6 is a perspective view that depicts a structure of a gradient coil according to a second embodiment.

FIG. 6 is a perspective view that depicts a structure of a gradient coil 120 according to the second embodiment. Each component that plays the same role as each unit shown in FIG. 2 is assigned with the same reference numeral, and detailed explanation of it is omitted. As shown in FIG. 6, according to the second embodiment, the gradient coil 120 includes an RF shield 128 in addition to the main coil 21 and the shield coil 22. The RF shield 128 is formed in a substantial drum shape, and provided on the inner circumferential side of the main coil 21.

Figure 7:
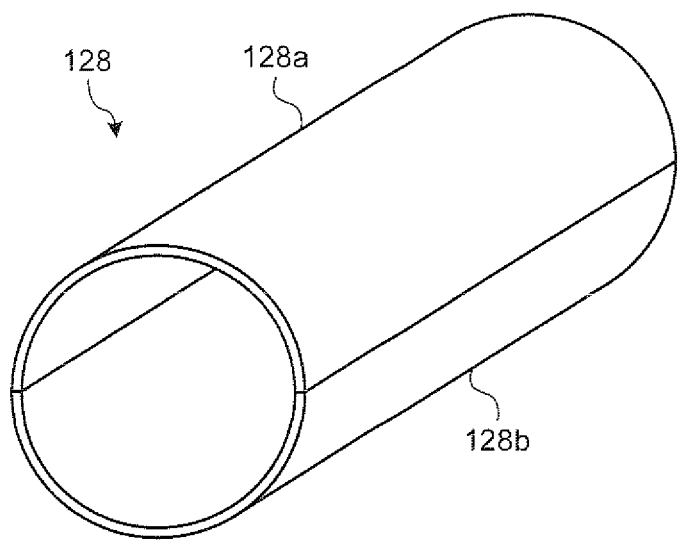
FIG. 7 is an appearance of a Radio Frequency (RF) shield according to the second embodiment.

FIG. 7 is an appearance of the RF shield 128 according to the second embodiment. As shown in FIG. 7, the RF shield 128 is formed in a substantial drum shape. The RF shield 128 is formed by combining, for example, two conductive plates 128*a* and 128*b* each of which is warped to have a semicircular cross section. Although explained below is a case of using two conductive plates, the RF shield 128 can be formed of one conductive plate or by combining three or more conductive plates.

According to the second embodiment, similarly to the first embodiment, the main-coil side cooling system 26 is provided in the vicinity of the main coil 21 on the outer circumferential side of the main coil 21. The shield-coil side cooling system 27 is provided in the vicinity of the shield coil 22 on the inner circumferential side of the shield coil 22. According to the second embodiment, cooling pipes are provided also in the innermost layer of the gradient coil 120. In this way, as the cooling pipes are provided also in the innermost layer of the gradient coil 120, cooling of the gradient coil 120 can be enhanced, and a temperature rise in the imaging zone in which the subject P is placed can be more securely suppressed.

Figure 8:
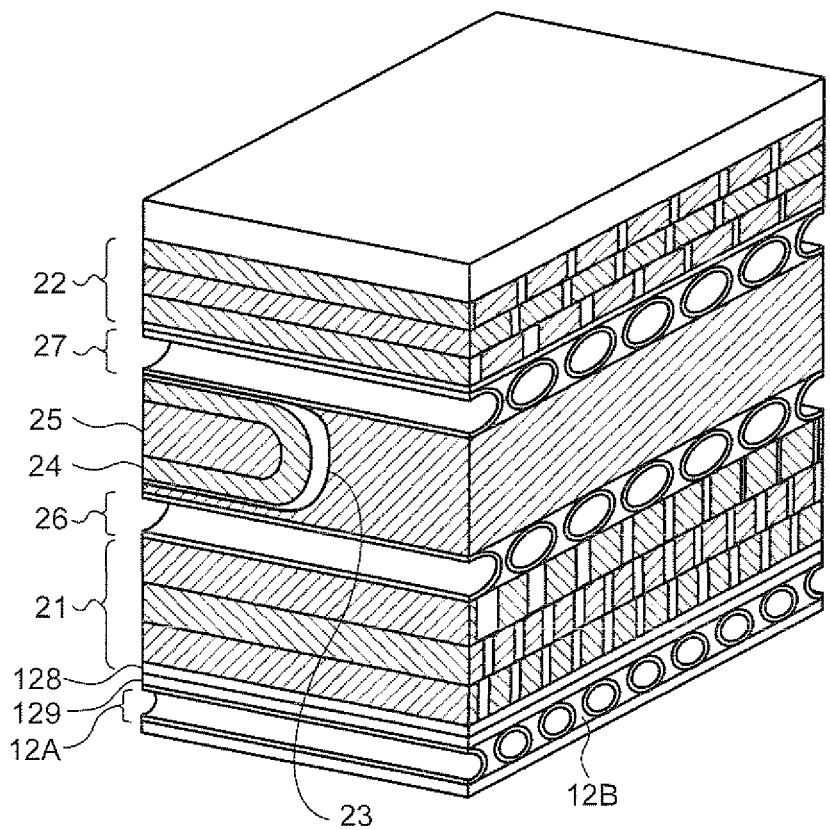
FIG. 8 is a structure diagram that depicts an internal structure of the gradient coil according to the second embodiment.

FIG. 8 is a structure diagram that depicts an internal structure of the gradient coil 120 according to the second embodiment. As shown in FIG. 8, between the shim-tray insert guides 23 and the main coil 21, the main-coil side cooling system 26 formed in a spiral fashion is embedded. Moreover, between the shim-tray insert guides 23 and the shield coil 22, the shield-coil side cooling system 27 formed in a spiral fashion is embedded. Cooling water sent from the chiller 90 flows into the main-coil side cooling system 26 and the shield-coil side cooling system 27, and the flowing-in cooling water circulates inside the gradient coil 20 through each cooling pipe, and then flows out to the outside of the gradient coil 120. In this way, the main coil 21, the shield coil 22, and the iron shims 25 are cooled by circulating cooling water through the main-coil side cooling system 26 and the shield-coil side cooling system 27.

Additionally, an RF-coil side cooling system 12A is provided on the inner side of the main coil 21. According to the second embodiment, the RF-coil side cooling system 12A is provided on the inner side of the RF shield 128 that is provided on the inner side of the main coil 21. The RF-coil side cooling system 12A includes a plurality of cooling pipes that are formed in a spiral fashion by using copper.

For example, if cooling pipes are provided between the main coil 21 and the RF shield 128, the RF shield 128 is closer to the RF coil 30 by the width of the cooling pipes, consequently, the RF coil 30 needs to generate a stronger radio-frequency magnetic field. However, as the radio-frequency magnetic field is strengthened, a Specific Absorption Rate (SAR) is increased, so that there is a possibility that the safety of the subject may be decreased. By contrast, according to the second embodiment, the RF-coil side cooling system 12A is provided on the inner side of the RF shield 128, so that a sufficient distance can be ensured between the RF shield 128 and the RF coil 30. Accordingly, the strength of a radio-frequency magnetic field does not need to be strengthened, so that the safety of the subject can be maintained.

Moreover, the cooling pipes included in the RF-coil side cooling system 12A are formed so as to have a smaller pipe diameter than the pipe diameter of the cooling pipes included in the main-coil side cooling system 26. Furthermore, the cooling pipes included in the RF-coil side cooling system 12A are formed to have smaller intervals of a spiral than those of the cooling pipes included in the main-coil side cooling system 26. In addition, the cooling pipes included in the RF-coil side cooling system 12A are formed to have an oval cross section that is compressed in the layered direction of the gradient coil 20.

Between the cooling pipes included in the RF-coil side cooling system 12A, a low dielectric material 12B is filled. The low-dielectric material used here can be, for example, Teflon (registered trademark), or PET. Accordingly, the cooling pipes included in the RF-coil side cooling system 12A can be prevented from electrically coupling.

Moreover, between the cooling pipes included in the RF-coil side cooling system 12A and the RF shield 128, an insulating film 129 formed from an insulating material is provided. The insulating material used here can be, for example, Teflon (registered trademark), or PET. Alternatively, the insulating material can be a Fiberglass Reinforced Plastics (FRP). Accordingly, the cooling pipes included in the RF-coil side cooling system 12A and the RF shield 128 can be prevented from electrically coupling. The RF-coil side cooling system 12A and the main-coil side cooling system 26 are provided on opposite sides of the main coil 21. Accordingly, the main coil 21 can be effectively cooled.

In such configuration, according to the second embodiment, the cooling pipes included in the RF-coil side cooling system 12A are provided similarly to the first cooling pipes 27*a* and the second cooling pipes 27*b* shown in FIG. 4. In other words, each of the cooling pipes included in the RF-coil side cooling system 12A is provided so as to extend from one end of the gradient coil 20 in the direction toward the other end, then to bend, and to return to the one end by winding in a spiral fashion around the drum shape of the gradient coil 20. Accordingly, the cooling pipes included in the RF-coil side cooling system 12A can be wound up to a position close to the end of the gradient coil 20, thereby being capable to cool a wide area in the imaging zone in which the subject is placed.

A third embodiment is explained below. The first and second embodiments are explained above in cases where cooling pipes are wound in a spiral fashion, however, the shape of cooling pipes is not limited to this. As another example, the third embodiment is explained below in a case where a cooling pipe is provided so as to turn along the length direction of the gradient coil 20.

Figure 9:
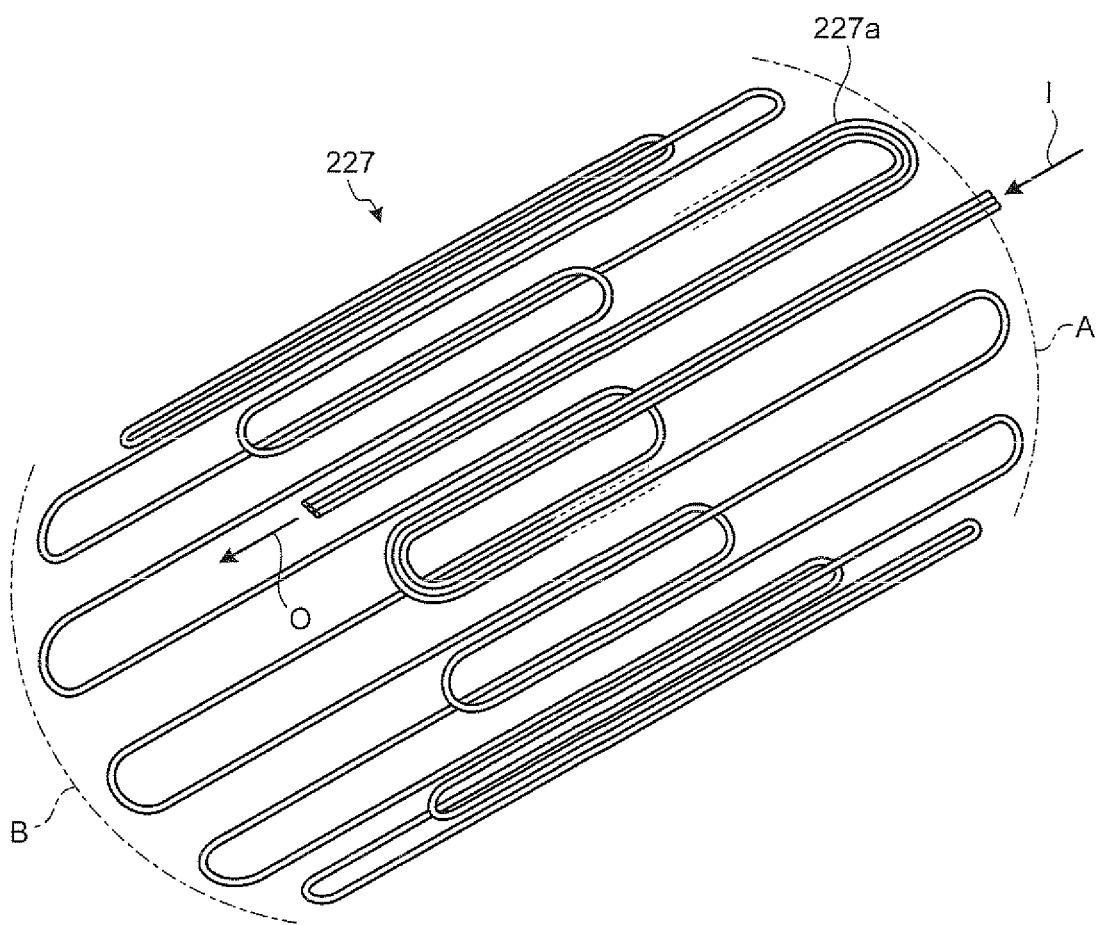
FIG. 9 is a perspective view that depicts a general configuration of a shield-coil side cooling system of cooling pipes according to a third embodiment.
Figure 10:
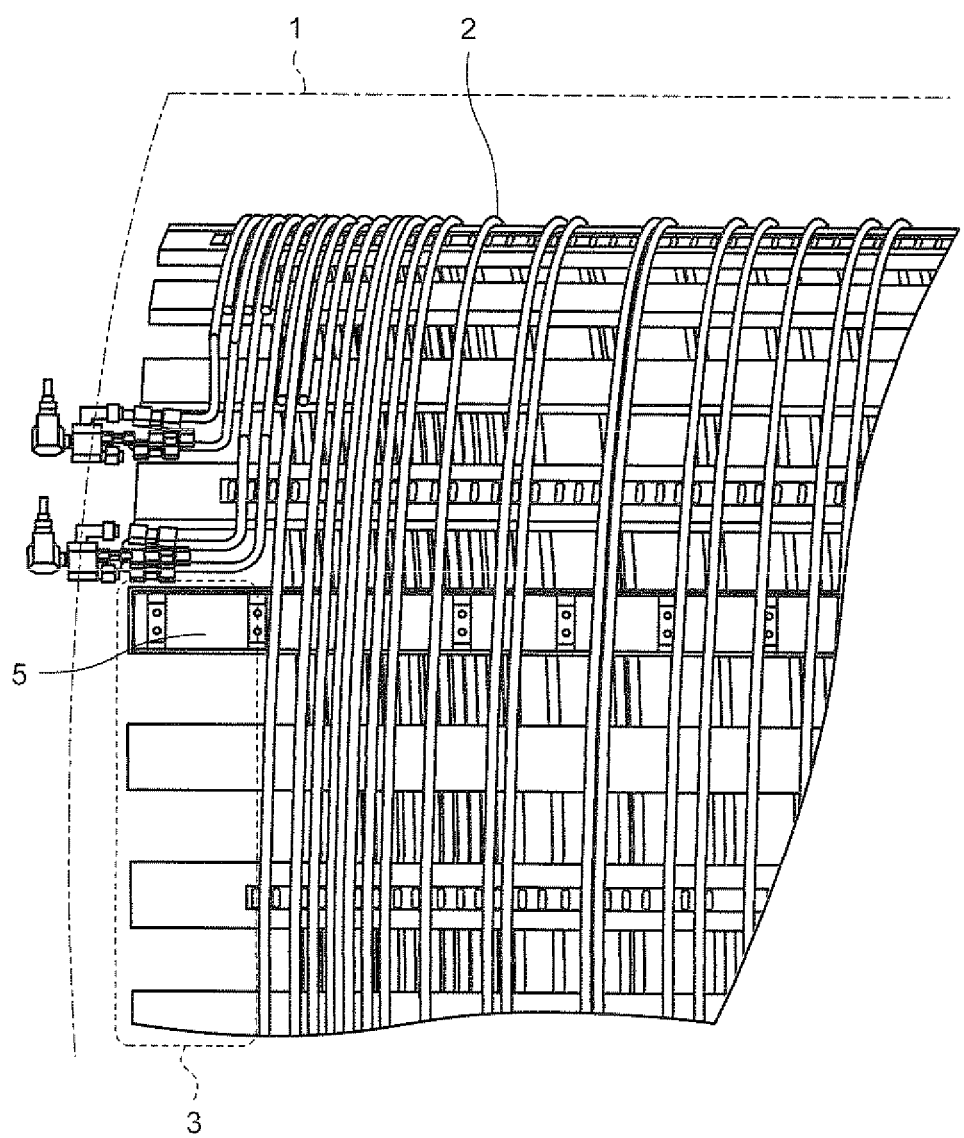
FIG. 10 is a schematic diagram for explaining a problem of a conventional technology using cooling pipes.

FIG. 9 is a perspective view that depicts a general configuration of a shield-coil side cooling system of cooling pipes according to the third embodiment. FIG. 9 depicts only first cooling pipes included in a shield-coil side cooling system 227. As shown in FIG. 9, according to the third embodiment, three first cooling pipes 227*a* are provided. Each of the first cooling pipes 227*a* is provided so as to repeat a shape extending from an end A of the gradient coil 20 in the direction toward another end B, then bending after reaching the end B, then extending from the end B in the direction toward the end A and further bending after reaching the end A, and then further extending from the end A in the direction toward the end B, by shifting the position in the circumferential direction of the gradient coil 20.

In each of the first cooling pipes 227a, cooling water flows so as to flow in from an end positioned at the end A of the gradient coil 20, and to flow out from an end positioned at the end B (see an arrow I and an arrow O). In other words, the first cooling pipes 227a take cooling water from one end and discharges it from the opposite end. The cooling water flowing into each of the first cooling pipes 227a is branched by the inlet-side manifold, similarly to the first cooling pipes 27a according to the first embodiment. The cooling water flowing out from each of the first cooling pipes 227a is joined by the outlet-side manifold, similarly to the first cooling pipes 27a according to the first embodiment.

Although not shown in FIG. 9, similarly to the first embodiment, second cooling pipes that circulate cooling water in the direction opposite to the direction of the first cooling pipes are provided in the gradient coil 20 in parallel along the first cooling pipe. Although the shield-coil side cooling system is explained above, cooling pipes included in the main-coil side cooling system and/or cooling pipes included in the RF-coil side cooling system can be arranged in the shape shown in FIG. 9.

In this way, by bending the first cooling pipes 227a at the both ends of the gradient coil 20, the first cooling pipes 227a can be arranged across a wide range in the length direction of the gradient coil 20. Accordingly, a wide range of the gradient coil 20 can be cooled.

Moreover, although the first, the second, and the third embodiments are explained above about an MRI apparatus including a gradient magnetic field formed in a substantial drum shape, the embodiment is not limited to this. For example, an MRI apparatus of a so-called open type that generates a gradient magnetic field perpendicular to the body axis of a subject can implement the technology explained in the above embodiments.

Generally, an MRI apparatus of the open type includes a pair of static magnetic-field magnets that are arranged on opposite sides of an imaging space in which a subject to be placed; a gradient coil that adds a gradient magnetic field to a static magnetic field generated in the imaging space by the static magnetic-field magnets; and an RF coil that applies a radio-frequency magnetic field onto the subject placed in the imaging space. For example, the pair of the static magnetic-field magnets are arranged in an upper position and a lower position, and vertically generate a static magnetic field. The gradient coil and the RF coil are each formed in a flat plate shape, and anchored to the upper and lower static magnetic-field magnets, respectively.

Even in the MRI apparatus of such open type, a cooling pipe for cooling heat generated on the gradient coil is sometimes provided in some cases. For example, in the MRI apparatus of the open type, for example, a cooling pipe is arranged in a swirl fashion on the same plane on the outer surface of the gradient coil or inside the gradient coil. In such case, for example, the cooling pipe is provided so as to extend from one end of the gradient coil in the direction toward the other end, then to bend, and to return to the one end by winding in a swirl fashion along the plane shape of the gradient coil. Accordingly, the cooling pipe can be wound up to a position close to an edge of the gradient coil, a wider range of the gradient coil can be cooled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a gradient coil formed in a substantially cylindrical shape and configured to apply a gradient magnetic field onto a subject placed in a static magnetic field generated in the gradient coil; and
a coil cooling pipe that includes a plurality of cooling pipes arranged in parallel and configured to cool the gradient coil by passing a coolant through each of the cooling pipes, wherein the coil cooling pipe extends from one end of the gradient coil in a direction toward an other end, then bends, and returns to the one end winding around the gradient coil.

2. The magnetic resonance imaging apparatus according to claim 1, wherein
the coil cooling pipe extends from the one end of the gradient coil in a direction toward the other end, then bends after reaching the other end, and returns to the one end winding around the gradient coil.

3. The magnetic resonance imaging apparatus according to claim 2, wherein
the gradient coil includes a groove that is formed along the direction from the one end to the other end, and
the coil cooling pipe is arranged in the groove included in the gradient coil, to extend from the one end of the gradient coil in a direction toward the other end, then to bend, and to return to the one end winding around the gradient coil.

4. The magnetic resonance imaging apparatus according to claim 3, wherein
the gradient coil includes a plurality of shim-tray insert guides each of which is a through hole forming openings at both ends of the gradient coil, and configured to insert therein a shim tray that accommodates iron shims configured to correct non-uniformity of the static magnetic field, and the groove is formed between the shim-tray insert guides.

5. The magnetic resonance imaging apparatus according to claim 2, wherein
the coil cooling pipe further includes a branched pipe that branches a coolant supplied from a chiller, and flows branched coolant into each of the cooling pipes.

6. The magnetic resonance imaging apparatus according to claim 2, wherein
the cooling pipes and the branched pipe are connected to one another via a tube formed from an insulating material.

7. The magnetic resonance imaging apparatus according to claim 2, wherein
the cooling pipe includes a first cooling pipe, and a second cooling pipe that is provided in parallel with the first cooling pipe, and
the second cooling pipe passes a coolant in a direction opposite to a direction in which the first cooling pipe passes a coolant.

8. The magnetic resonance imaging apparatus according to claim 2, wherein the coil cooling pipe further bends after returning to the one end by winding along the shape of the gradient coil, and then extends the other end of the gradient coil.

9. The magnetic resonance imaging apparatus according to claim 2, wherein
the gradient coil includes
a main coil configured to apply a gradient magnetic field onto a subject placed in the static magnetic field, and
a shield coil that is provided on an outer circumferential side of the main coil, and configured to shield the gradient magnetic field generated by the main coil,
the coil cooling pipe includes a shield-coil side cooling pipe that is provided in a vicinity of the shield coil, and configured to cool the shield coil by passing a coolant therethrough, and
the shield-coil side cooling pipe extends from the one end of the gradient coil in a direction toward the other end, then bends, and returns to the one end winding around the gradient coil.

10. The magnetic resonance imaging apparatus according to claim 9, wherein
the coil cooling pipe includes a main-coil side cooling pipe that is provided in a vicinity of the main coil, and the main coil by passing a coolant therethrough, and
the main-coil side cooling pipe extends from the one end of the gradient coil in a direction toward the other end, then bends, and returns to the one end by winding around the gradient coil.

11. The magnetic resonance imaging apparatus according to claim 1, wherein
the gradient coil includes a groove that is formed along the direction from the one end to the other end, and
the coil cooling pipe is arranged in the groove included in the gradient coil, to extend from one end of the gradient coil in a direction toward an other end, then to bend, and to return to the one end by winding the gradient coil.

12. The magnetic resonance imaging apparatus according to claim 11, wherein
the gradient coil includes a plurality of shim-tray insert guides each of which is a through hole forming openings at both ends of the gradient coil, and configured to insert therein a shim tray that accommodates iron shims configured to correct non-uniformity of the static magnetic field, and the groove is formed between the shim-tray insert guides.

13. The magnetic resonance imaging apparatus according to claim 1, wherein
the coil cooling pipe further includes a branched pipe that branches a coolant supplied from a chiller, and flows branched coolant into each of the cooling pipes.

14. The magnetic resonance imaging apparatus according to claim 1, wherein
the cooling pipes and the branched pipe are connected to one another via a tube formed from an insulating material.

15. The magnetic resonance imaging apparatus according to claim 1, wherein
the cooling pipe includes a first cooling pipe, and a second cooling pipe that is provided in parallel with the first cooling pipe, and
the second cooling pipe passes a coolant in a direction opposite to a direction in which the first cooling pipe passes a coolant.

16. The magnetic resonance imaging apparatus according to claim 1, wherein
the coil cooling pipe further bends after returning to the one end by winding along the shape of the gradient coil, and then extends to the other end of the gradient coil.

17. The magnetic resonance imaging apparatus according to claim 1, wherein
the gradient coil includes
a main coil configured to apply a gradient magnetic field onto a subject placed in the static magnetic field, and
a shield coil that is provided on an outer circumferential side of the main coil, and configured to shield the gradient magnetic field generated by the main coil,
the coil cooling pipe includes a shield-coil side cooling pipe that is provided in a vicinity of the shield coil, and configured to cool the shield coil by passing a coolant therethrough, and
the shield-coil side cooling pipe extends from the one end of the gradient coil in a direction toward the other end, then bends, and returns to the one end winding around the gradient coil.

18. The magnetic resonance imaging apparatus according to claim 17, wherein
the coil cooling pipe includes a main-coil side cooling pipe that is provided in a vicinity of the main coil, and configured to cool the main coil by passing a coolant therethrough, and
the main-coil side cooling pipe extends from the one end of the gradient coil in a direction toward the other end, then bends, and returns to the one end winding around the gradient coil.

* * * * *